(12) United States Patent
Itkin et al.

(10) Patent No.: US 7,650,122 B2
(45) Date of Patent: Jan. 19, 2010

(54) POWER CONTROL CIRCUITRY FOR A MOBILE TERMINAL APPLICATION

(75) Inventors: Grigory Itkin, München (DE); Andrei Kabanov, Malmö (SE)

(73) Assignee: Sony Ericsson Mobile Communications AB, Lund (SE)

( * ) Notice: Subject to any disclaimer, the term of this patent is extended or adjusted under 35 U.S.C. 154(b) by 639 days.

(21) Appl. No.: 10/595,436
(22) PCT Filed: Sep. 8, 2004
(86) PCT No.: PCT/EP2004/010031
§ 371 (c)(1),
(2), (4) Date: Nov. 7, 2006
(87) PCT Pub. No.: WO2005/041438
PCT Pub. Date: May 6, 2005

(65) Prior Publication Data
US 2007/0153937 A1   Jul. 5, 2007

(30) Foreign Application Priority Data
Oct. 23, 2003   (EP) ................... 03024457

(51) Int. Cl.
H04B 1/04   (2006.01)
H01Q 11/12   (2006.01)
(52) U.S. Cl. .................... 455/126; 455/127.1
(58) Field of Classification Search ............. 455/126, 455/127.1, 127.2, 115.1, 522, 343.1; 330/278, 330/285, 291; 375/296–297
See application file for complete search history.

(56) References Cited

U.S. PATENT DOCUMENTS 4,442,407 A   4/1984   Apel (Continued)

FOREIGN PATENT DOCUMENTS

EP   0 600 252 A1   11/1993
EP   1 229 664 A1   8/2002

OTHER PUBLICATIONS

International Search Report for Appln. No. PCT/EP2004/010031, mailed Dec. 10, 2004.

*Primary Examiner*—Pablo N Tran
(74) *Attorney, Agent, or Firm*—Renner, Otto, Boisselle & Sklar, LLP

(57) ABSTRACT

The present invention generally relates to the field of automatic power control (APC) circuitries used in the analog front end of a mobile transmitter. It particularly refers to a power control circuitry (101M, 101N) and a corresponding method for controlling the power level ($P_{out}$) of an RF signal (x(t)) to be transmitted at the output port of a variable-gain power amplifier (105) by performing an additional regulation of the APC loop's reference signal ($V_{ref}$). Thereby, it is proposed to increase the radiated RF power ($P_{out}$) in case a transmitting antenna (110) is mismatched to said power amplifier (105) in order to not release an ongoing call. In case there is a subject very close to the terminal antenna, the antenna load is changed and the increased reflected signal is measured. In a closed loop this increased reflected signal is mixed with a reference ramp signal ($V_{ramp}$) which is used to calculate (S1A) a reference signal ($V_{ref}$) representing the nominal power level ($P_{ref}$) for the power ($P_{out}$) of the RF signal (x(t)) to be transmitted, which leads to an increasing of the radiated power and prevents said call from being released.

The step of calculating (S1A) the reference signal ($V_{ref}$) as a function of the reference ramp signal ($V_{ramp}$) and a DC feedback signal ($V_{PD}$) is realized by the substeps of multiplying (S1a') a processed version ($K \cdot G_{OP} \cdot V_{PD}$) of the DC feedback signal ($V_{PD}$) by the reference ramp signal ($V_{ramp}$) and adding (S1a'') the output signal ($V_{ramp} \cdot K \cdot G_{OP} \cdot V_{PD}$) of the multiplication step (S1a') to the reference ramp signal ($V_{ramp}$), thereby yielding said reference signal ($V_{ref}$).

6 Claims, 11 Drawing Sheets

U.S. PATENT DOCUMENTS

| | | | |
|---|---|---|---|
| 5,056,109 A | 10/1991 | Gilhousen et al. | |
| 5,311,143 A | 5/1994 | Soliday | |
| 5,603,106 A | 2/1997 | Toda | |
| 6,070,058 A | 5/2000 | Waldroup et al. | |
| 6,137,357 A * | 10/2000 | Dekker | 330/129 |
| 6,330,455 B1 * | 12/2001 | Ichihara | 455/522 |
| 6,563,385 B2 | 5/2003 | Wojslaw | |
| 6,844,788 B2 * | 1/2005 | Chadwick | 332/159 |
| 6,879,814 B2 * | 4/2005 | Kaikati et al. | 455/127.1 |
| 7,027,785 B2 * | 4/2006 | Summers et al. | 455/126 |
| 7,099,636 B2 * | 8/2006 | Rozenblit et al. | 455/126 |
| 7,353,006 B2 * | 4/2008 | Gels et al. | 455/126 |
| 7,529,526 B2 * | 5/2009 | Brindle et al. | 455/127.1 |
| 7,546,098 B2 * | 6/2009 | Gilbert | 455/126 |
| 7,551,687 B2 * | 6/2009 | Ode et al. | 375/296 |
| 7,558,539 B2 * | 7/2009 | Huynh et al. | 455/126 |
| 7,570,931 B2 * | 8/2009 | McCallister et al. | 455/126 |

* cited by examiner

POWER CONTROL CIRCUITRY FOR A MOBILE TERMINAL APPLICATION

FIELD AND BACKGROUND OF THE INVENTION

The present invention generally relates to the field of automatic power control (APC) circuitries used e.g. in the analog front end of a mobile transmitter. It particularly refers to different embodiments of a closed-loop power control circuitry integrated into the analog front end of a mobile transmitter and a corresponding method for controlling the radiated power level of an RF signal to be transmitted at the output port of a variable-gain power amplifier integrated into said mobile RF transmitter by performing an additional regulation of the APC loop's reference signal.

In the last few years the demand for high-efficient power control circuitries applied to wireless communication devices has ever increased. One key task in closed-loop power control is the design of analog circuitries to be integrated in the analog front end of a wireless RF transmitter which are used for controlling the output power $P_{out}$ of an RF signal x(t) to be transmitted over the time t. Ramping too fast results in an unwanted spread of the RF spectrum, and a too slow ramping violates prescribed time constraints. The output power $P_{out}$, which is usually supplied by a power amplifier (PA) at the output port of the wireless RF transmitter, is thereby set by an external control voltage $V_{ctrl}$. The relation between $V_{ctrl}$ and $P_{out}$ is often nonlinear and influenced by temperature, tolerances, supply voltage, frequency and PA input power. To accomplish a sufficient stabilization of $P_{out}$, a power control loop is needed, although some designers still use non-feedback concepts, e.g. by controlling the PA supply voltage. Such a control loop typically comprises an RF detector and a loop amplifier which is supplied by an input signal from a baseband controller. Conventional power control loop designs mainly differ in the respectively applied RF detector, but the loop amplifier also involves interesting design aspects.

One important issue in power control loop design is the dynamic range. For a GSM-based mobile phone the maximum antenna power is 33 dBm, and the minimum power level is 5 dBm. The detector dynamic must be significantly higher, e.g. greater than 34 dB, which is relatively close to what a good diode detector is capable of. Another reason for the need of a large dynamic range is that e.g. in a conventional TDMA-based communication system the power amplifier starts from "power-down" mode in which the RF level is determined by noise and cross talk. This level should be lower than about −48 dBm for the GSM system, which would result in a dynamic range of more than 70 dB. If a control $V_{ctrl}$ voltage is applied to the control input of the power amplifier, the output power $P_{out}$ increases. But due to the finite detector dynamic, the loop is not locked and at the point the detector responds a large overshoot may occur.

Two issues make power control loop design a difficult task. One is that some power amplifiers are not very fast, which means that there might be a significant delay between a step $\Delta V_{ctrl}$ at the control input and the corresponding change $\Delta P_{out}$ in output power. This limits the speed of the power control loop and can cause instabilities. The second problem is that power amplifiers and many detectors are nonlinear circuit elements. When a power control loop is built with an ideal linear detector and a linear loop amplifier, an ideal power amplifier would have a constant slope $dP_{out}/dV_{ctrl}$, but in reality $dP_{out}/dV_{ctrl}$ is a function of the control voltage $V_{ctrl}$, which results in a bias-dependent overall loop gain and makes frequency compensation of the feedback system rather difficult. If the loop is stable, however, the circuit might be too slow for some power levels.

The power amplifier is the component of a mobile transmitter that amplifies the RF signal x(t) to be transmitted to the necessary power level $P_{out}$ needed to drive the transmitting antenna. In most wireless communications systems, the power amplifier is the largest power consumer, usually because the amount of power that needs to be sent to the antenna (the power output) is itself very large. This does not include the total power that is consumed within the power amplifier, just the amount of power which is required to drive the antenna. The total power consumed by the power amplifier is necessarily greater than the power output, as there will always be some power consumed in the active devices and the peripheral circuitry. Since the power output specification itself is often larger than the power consumption of the rest of the blocks in the RF system and the power consumption of such a power amplifier will be higher than the specified power output, the power amplifier is decidedly the major power consumer of the system.

Because the levels of power required to reliably transmit the modulated RF signal x(t) are often relatively high, there is a lot of power consumed within the power amplifier. In many wireless applications, the amount of power consumed by this amplifier is not critical; as long as the signal being transmitted is of adequate power, that is good enough. However, in a situation where there is only a limited amount of energy available, which is not sufficient for the transmission procedure, the power consumed by all devices must be minimized, so as to maximize the length of time for which that energy is available.

The number of different classes of power amplifiers which are used today is too numerous to be counted, and they range from entirely linear to entirely non-linear, as well as from quite simple to inordinately complex. In PA terminology, a "linear" power amplifier is one which has a linear relationship between its input and output. Although a power amplifier may comprise transistors operating in a nonlinear fashion (e.g. in case a FET switches between cut-off and saturation), it can still be considered linear. While nonlinear power amplifiers feature a comparatively high efficiency, their nonlinearity causes the output signal to spread (due to intermodulation products, especially if there is a lot of phase noise in the local oscillator which will cause spreading of the input to the power amplifier).

A typical power amplifier consists of several serial stages. Each stage is usually larger and more powerful than the previous one. As most of the quiescent current is drawn by the high power stages, which are not required for the low output power levels needed for wireless communication, means for bypassing high power stages when they are not required lead to a significant reduction of energy consumption.

Since wireless telephones operate on battery power, it is also desirable that their transmitters operate as efficiently as possible to conserve power and extend battery life. Ideally for W-CDMA systems, such as those governed by the UMTS standard, power amplifier stages should be capable of efficient, linear operation in their required dynamic range. However, the prior art has not yet come close to the ideal, and many wireless telephones are having poor power management now. During low power transmissions, power is wasted by cascaded amplifier stages that are not needed. Consequently, attempts have been made to bypass unused stages.

Under normal operating conditions, conventional wireless RF transceivers devices use an automatic power control (APC) circuit to control the output power of their amplification stages. The APC circuit found in most RF transceivers has an external connection that is intended to be connected to a linear power amplifier. After having detected the power of the modulated RF signal at the output port of the final power amplifier, said signal is converted to a DC voltage and fed back to a variable-gain intermediate frequency (IF) stage in order to keep the final output power constant over a long period of time. As the APC voltage generation is done very early, the gain drift, which is caused by thermal drift, operating voltage deviation, etc., is not compensated by the circuit. Another option is to derive the APC voltage from the drive power of the final amplifier and feed it to the external APC input of the RF transceiver. The theory is that when the power amplifier becomes overdriven, it will produce a negative voltage that is fed back into the transceiver's APC circuitry. This voltage acts as a gain control in the transmit stages of the transceiver which, in turn, automatically lowers the drive power (the transceiver's output power) and limits distortion from the overdriven amplifier.

FIG. 1a shows a schematic block diagram of a conventional APC loop 100a according to the state of the art, which is used for stabilizing the power at the RF output port 114b' of an analog circuitry realizing an RF signal generator. This circuit can also be used for executing an amplitude modulation (AM). It comprises a frequency synthesizing unit 102' (FSU), a power divider 106" (e.g. a directional coupler), which feeds the reflected wave of the modulated RF output signal to a wideband detector diode 108', and an amplification stage 112' whose output signal is fed to an electronically controlled attenuator 103', e.g. an amplitude modulator stage which comprises current-controlled PIN diodes realizing a tunable resistor with hybrid microwave integrated circuit (MIC) technology. In case said RF signal generator is used for sweep-frequency applications, an external detector (not shown) is usually applied in order to keep the power level at the input port of a tested RF unit constant.

FIG. 1b shows a schematic block diagram of a QAM transmitter 100b for a wireless communication device in an EDGE-based communication environment comprising an APC loop 101 according to the state of the art, which is used for stabilizing the power level $P_{out}$ of the RF output signal at the transmit antenna 110 of the QAM transmitter 100b. Thereby, the output port of a comparator stage 112, supplied with a reference signal $V_{ref}$ representing the nominal power level $P_{ref}$ for the power $P_{out}$ of the RF output signal x(t), whose actual output power level is supplied by a directional coupler 106' and fed back to the APC loop 101 by a wideband detector diode 108, is connected with the gain control input port of a variable-gain power amplifier 105, which controls the output power level $P_{out}$ of the QAM transmitter 100b.

The complex-valued analog baseband signal $x_{LP}(t)$ (the complex envelope or equivalent low-pass signal of the real-valued RF band-pass signal x(t) to be transmitted) can thereby be written as follows:

$$x_{LP}(t) = i(t) + j \cdot q(t) = a(t) \cdot e^{j \cdot \varphi(t)} \quad (1)$$

with $$i(t) := \text{Re}\{x_{LP}(t)\}, \quad (1a)$$

$$q(t) := \text{Im}\{x_{LP}(t)\}, \quad (1b)$$

$$a(t) := |x_{LP}(t)| = \sqrt{i^2(t) + q^2(t)}, \quad (1c)$$

-continued $$\varphi(t) := \angle x_{LP}(t) = \arctan\left(\frac{q(t)}{i(t)}\right), \quad (1d)$$

and $j := \sqrt{-1}$ is the imaginary unit. Thereby, i (t) denotes the in-phase (I) component of $x_{LP}$ (t) in time domain, q (t) denotes the quadrature (Q) signal of $x_{LP}$ (t) in time domain, a(t) denotes the magnitude component of $x_{LP}$ (t), which is given by the envelope of x(t), and $\varphi$(t) denotes the phase component of $x_{LP}$ (t), which is also the phase component of x(t)

i(t) and q(t) are directly up-converted from the baseband to an RF band by means of two modulator stages 104a and 104b, respectively, which are driven by a local oscillator 102 providing a high-frequent carrier signal with a sinusoidal waveform $$c_i(t) \equiv c(t) := A_c \cdot \cos(2\pi \cdot f_{LO} \cdot t), \quad (2a)$$

wherein $A_c$ (in $\sqrt{W}$) is the amplitude factor of the carrier signal $c_i(t)$ and $f_{LO}$ (in GHz) is the carrier frequency supplied by the local oscillator 102. A Hilbert transformer 104c, connected to one input port of the up-conversion mixer 104a, provides a 90-degree phase shift of the carrier signal $c_i(t)$ such that the carrier signal used for a direct up-conversion of the quadrature signal q(t) from the baseband to the RF band is given by $$c_q(t) := A_c \cdot \cos\left(2\pi \cdot f_{LO} \cdot t + \frac{\pi}{2}\right) = -A_c \cdot \sin(2\pi \cdot f_{LO} \cdot t). \quad (2b)$$

Using $x_{LP}(t)$ (or i(t) and q(t), respectively), the modulated RF signal x(t) to be transmitted can thus be written as follows:

$$\begin{aligned}x(t) &= \text{Re}\{x_{LP}(t) \cdot e^{+j \cdot 2\pi \cdot f_{LO} \cdot t}\} \\&= i(t) \cdot c_i(t) + q(t) \cdot c_q(t) \\&= i(t) \cdot \cos(2\pi \cdot f_{LO} \cdot t) - q(t) \cdot \sin(2\pi \cdot f_{LO} \cdot t)\end{aligned} \quad (3)$$

Before being transmitted, the obtained RF signal x(t) has to be amplified since a certain output power level $P_{out}$ is needed to reach a receiver at a certain distance. For this reason, a gain-controlled power amplifier 105 is needed.

Due to the bursted nature of the RF power of a transmitted signal stream in the uplink of a TDMA-based communication system, the output power of a wireless RF transmitter has to be ramped up to an appropriate level or ramped down to zero between different time slots, respectively, such that the RF output power $P_{out}$ is constant during transmission in order to facilitate time-division multiplexing of different TDMA channels. A certain time before the transmission of the data starts, the mobile terminal increases the transmission power from zero to the desired output power level $P_{out}$. This part of the respective time slot $TS_i$ is called "ramp up". After the desired output power level $P_{out}$ is reached, the transmission of the data starts. This part of the respective time slot $TS_i$ is normally referred to as "useful part". The last part of $TS_i$ is then called "ramp down".

Today, this ramp-up and ramp-down procedure for stabilizing the output power level $P_{out}$ of a QAM transmitter 100b is realized by means of an APC circuitry 101 according to the state of the art as depicted in FIG. 1b. Thereby, the output port of a comparator stage 112 supplied with a reference signal $V_{ref}$ representing the nominal power level $P_{ref}$ for the power $P_{out}$ of the RF output signal and the actual output power level $P_{out}$ is connected to the gain control input port of a variable-gain power amplifier 105 controlling said output power level $P_{out}$. The actual output power level $P_{out}$ is supplied either by direct measurement (as shown in FIG. 1b, where a part of $P_{out}$ is coupled out by means of a directional coupler 106' and fed back to the APC loop 101 by means of a wideband detector diode 108) or by indirect measurement (e.g. by measuring the supply current of the power amplifier 105, which is direct proportional to the output power $P_{out}$). The measured voltage level $V_{PD}$ proportional to $P_{out}$ is then compared with the nominal voltage level $V_{ref}$ proportional to the power level $P_{ref}$. If the actual power level $P_{out}$ is higher than the power level $P_{ref}$ of the reference signal, the gain $G_{PA}$ of the variable-gain power amplifier 105 is decreased in order to adjust $P_{out}$. Vice versa, $G_{PA}$ is increased if $P_{out}$ is lower than $P_{ref}$ in order to adjust $P_{out}$. During the "ramp-up" part the nominal power level $P_{ref}$ is increased, during the "ramp-down" part it is decreased, and during the "useful" part it remains stable. Since the APC loop 101 adjusts the output power level $P_{out}$ according to the power level $P_{ref}$ of the reference signal, the output power $P_{out}$ is ramped up or down, respectively, and remains at a predefined level during the "useful" part.

FIG. 2a shows a block diagram 200a illustrating the principle of a conventional closed-loop power control circuitry for stabilizing the radiated power level $P_{out}$ of a modulated RF signal x(t) to be transmitted at the output port of an integrated variable-gain power amplifier 105, wherein said conventional closed-loop power control circuitry is realized as a current sense loop 101M according to the state of the art (here for the sake of simplicity called current sense APC loop). This current sense APC loop 100M can advantageously be applied to mobile RF transmitters which are equipped with a patch antenna. Said current sense loop 101M is equipped with a microcontroller 202 (µC) having an input port (2) supplied with a reference signal $V_{ref}$ representing the nominal power level $P_{ref}$ for the output power $P_{out}$ of the RF signal x(t) to be transmitted and a further input port (1) supplied with a signal which is derived from a voltage drop $U_{RM}$ at a low-ohm resistor $R_M$ serving as a current sensor 204 in the power supply line of the variable-gain power amplifier 105, wherein said voltage drop $U_{RM}$ is proportional to the DC supply current $I_{PA}$ of the variable-gain power amplifier 105. The power control signal at the output port of said microcontroller 202 is low-pass-filtered and fed to a first input port (a power control input port) of the power amplifier 105. Moreover, the current sense APC loop 101M comprises a digital signal processing means 201C which is used for providing a reference ramp signal $V_{ramp}$ which serves as said reference signal $V_{ref}$.

As depicted in FIG. 2b, which shows a technical realization 200b of the above-mentioned current sense APC loop 200a, said microcontroller 202 comprises an operational amplifier 113 which is used for amplifying a signal derived from said voltage drop $U_{RM}$ and a comparator stage 112" having a first input port supplied with a reference signal $V_{ref}$ representing the nominal power level $P_{ref}$ for the output power $P_{out}$ of the RF signal x(t) to be transmitted as well as a second input port supplied with an amplified version of the signal which is derived from said voltage drop $U_{RM}$.

BRIEF DESCRIPTION OF THE STATE OF THE ART

U.S. Pat. No. 4,442,407 refers to a two-loop automatic level control (ALC) circuitry for a power amplifier. Thereby, the power supply potential applied to the final stage of an RF amplifier is modulated by a first ALC loop in accordance with an error signal derived from a comparison of a signal corresponding to the weighted sum of the magnitude of the supply voltage applied and the current drawn by the final amplifier and the amplitude of the modulating signal.

U.S. Pat. No. 6,563,385 B2 discloses a method and an apparatus for adjusting the DC bias of an RF amplifier in case of changing operating conditions, e.g. if multiple modulation techniques are applied and no RF signal is present. Thereby, to optimally bias an RF amplifier configured to amplify carrier signals modulated with two or more data modulation techniques, the bias point needs to be dynamically set depending on how the signal being amplified is modulated.

U.S. Pat. No. 5,603,106 reveals a transmission power control circuit which is not affected by the frequency dependency of the elements and which can be adjusted for all transmission power levels to be selected. The circuit comprises a control data table in which digital data of a monitor voltage depending on a transmission power level for a plurality of values of transmissions frequency and a plurality of values of transmission power are stored.

U.S. Pat. No. 6,070,058 reveals a control loop for controlling the output power in order to avoid exceeding a certain limit. The output power control system determines when the total output power exceeds an output power trigger level and automatically enters a saturation prevention mode such that the total output power is reduced through modification of a closed-loop power control register. In one embodiment of this invention, an output detector and an output comparator continuously monitor the output power, and in another embodiment of this invention an analog-to-digital converter samples output power levels.

EP 1 229 664 A1 pertains to a mobile terminal with a warning system for the user in case that the energy radiation becomes to high and may damage a user's brain.

SHORTCOMINGS OF THE STATE OF THE ART

The documents U.S. Pat. Nos. 4,442,407, 6,563,385, U.S. Pat. No. 5,603,106 and U.S. Pat. No. 6,070,058 cited above do not handle the problem that when a subject comes close to the terminal antenna an ongoing call may be released.

In EP 1 229 664 A1 the reflected power of the transmit antenna is measured, but the document reveals no closed-loop control to automatically adjust the power level of an RF signal to be transmitted.

OBJECT OF THE UNDERLYING INVENTION

In view of the state of the art cited above, it is the object of the present invention to provide a power control technique and a corresponding automatic power control (APC) circuitry for stabilizing the power level of a signal to be transmitted, wherein said APC circuitry should be able to adjust the radiated power such that an ongoing call is not released e.g. when the transmitting antenna is mismatched to a power amplifier.

The aforementioned object is achieved by means of the features in the independent claims. Advantageous features are defined in the dependent claims.

SUMMARY OF THE INVENTION

The present invention proposes a closed-loop power control circuitry integrated e.g. into the analog front end of a mobile transmitter and a corresponding method for controlling the radiated power level $P_{out}$ of a modulated RF signal x(t) to be transmitted at the output port of a variable-gain power amplifier integrated into said mobile RF transmitter by performing an additional regulation of the APC loop's reference signal $V_{ref}$. Thereby, it is proposed to increase the radiated RF power $P_{out}$ in case the transmit antenna of the transmitter is mismatched to said power amplifier in order to not release an ongoing call. If there is a subject very close to the terminal antenna, the antenna load is changed and the increased reflected signal is measured. In a closed loop this increased reflected signal is mixed with a reference ramp signal $V_{ramp}$ which is used to calculate a reference signal $V_{ref}$ representing the nominal power level $P_{ref}$ for the power $P_{out}$ of the modulated RF signal x(t) to be transmitted, which leads to an increasing of the radiated power and prevents said call from being released.

BRIEF DESCRIPTION OF THE DRAWINGS

Advantageous features, aspects, and useful embodiments of the invention will become evident from the following description, the appended claims, and the accompanying drawings. Thereby.

DETAILED DESCRIPTION OF THE PRESENT INVENTION

In the following, different embodiments of the present invention as depicted in FIGS. 3a-c and 4a-d shall be explained in detail. The meaning of all the symbols designated with reference signs in FIGS. 1a to 4d can be taken from an annexed table.

Figure 1A:
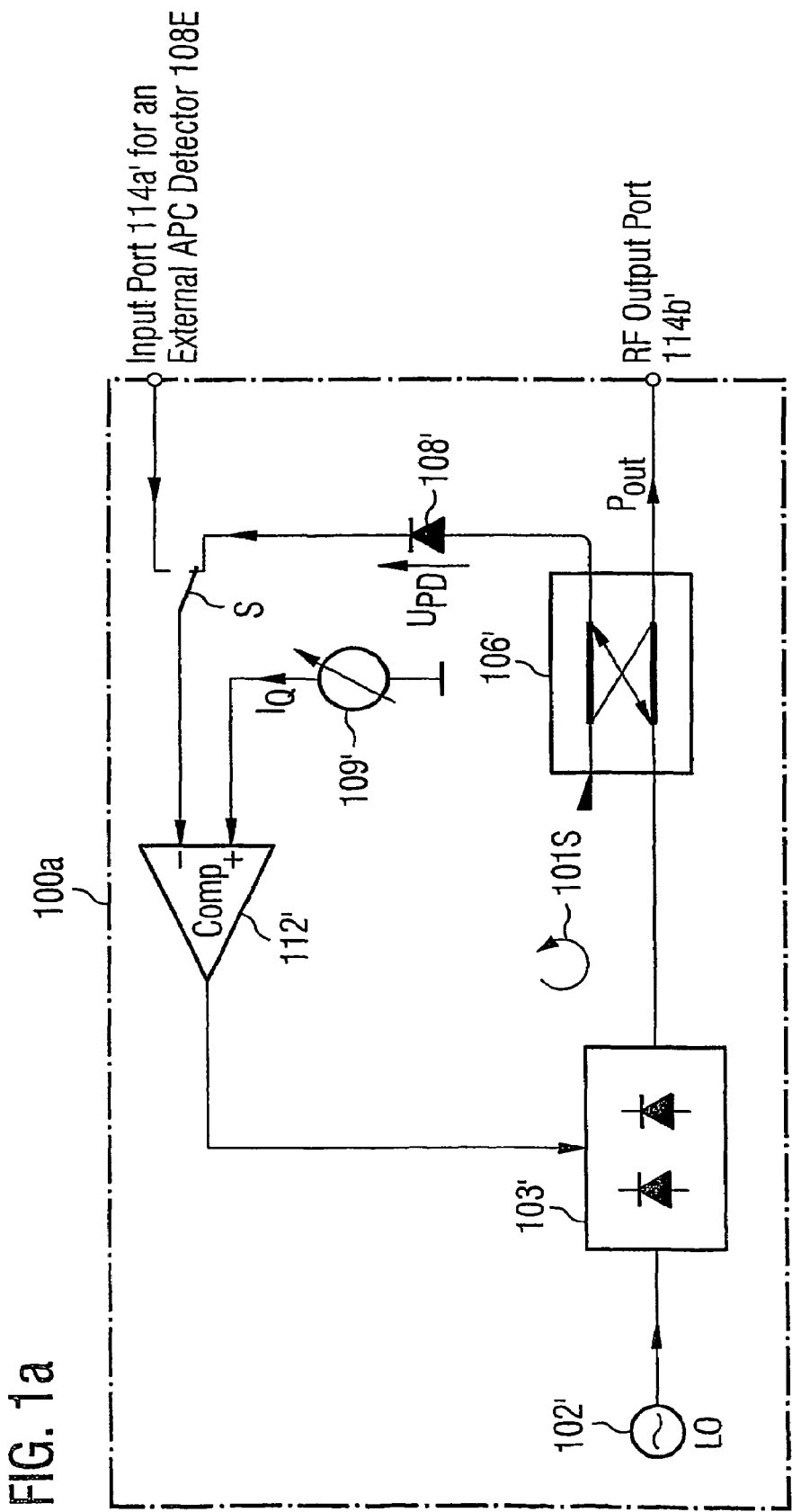
FIG. 1a shows a schematic block diagram of an analog RF signal generator comprising a conventional automatic power control (APC) loop according to the state of the art which is used for stabilizing the power level $P_{out}$ at the output port of an RF signal generator.
Figure 1B:
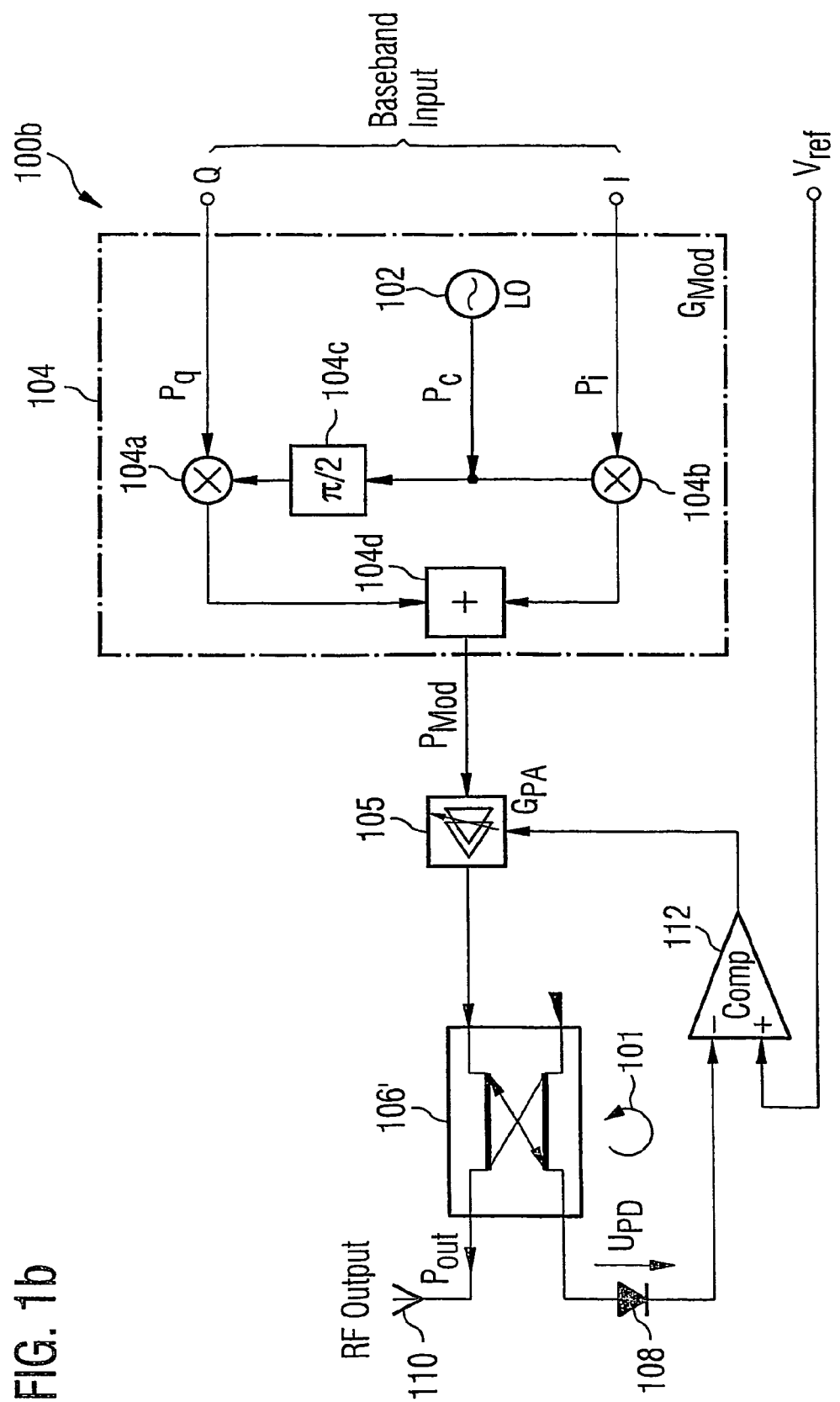
FIG. 1b shows a schematic block diagram of a QAM transmitter having an automatic power control (APC) circuitry according to the state of the art that is used for stabilizing the power level $P_{out}$ at the output port of a QAM transmitter.
Figure 2A:
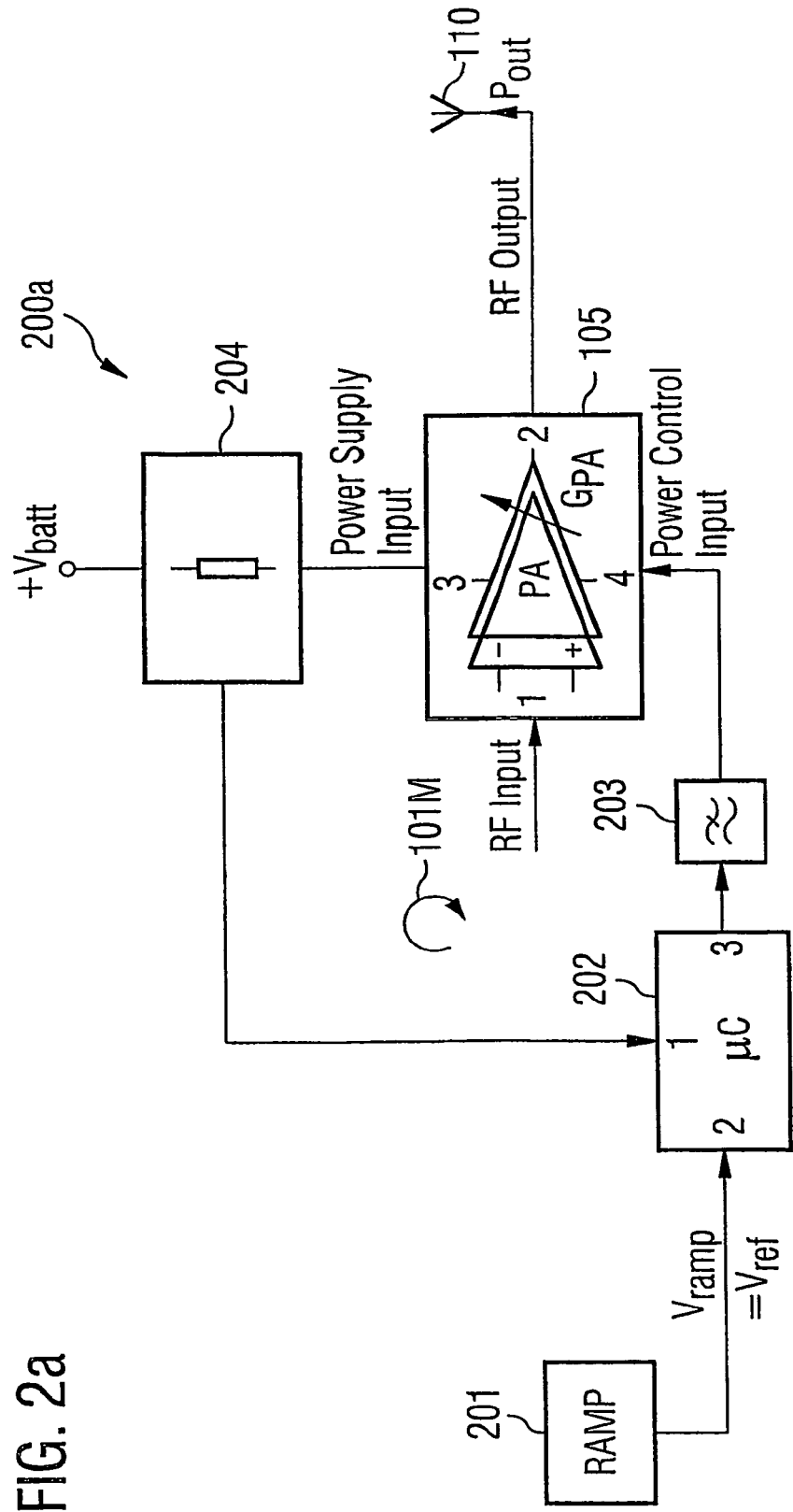
FIG. 2a is a block diagram illustrating the principle of a conventional closed-loop power control circuitry which is realized as a current sense loop according to the state of the art (in the following called current sense APC loop)
Figure 2B:
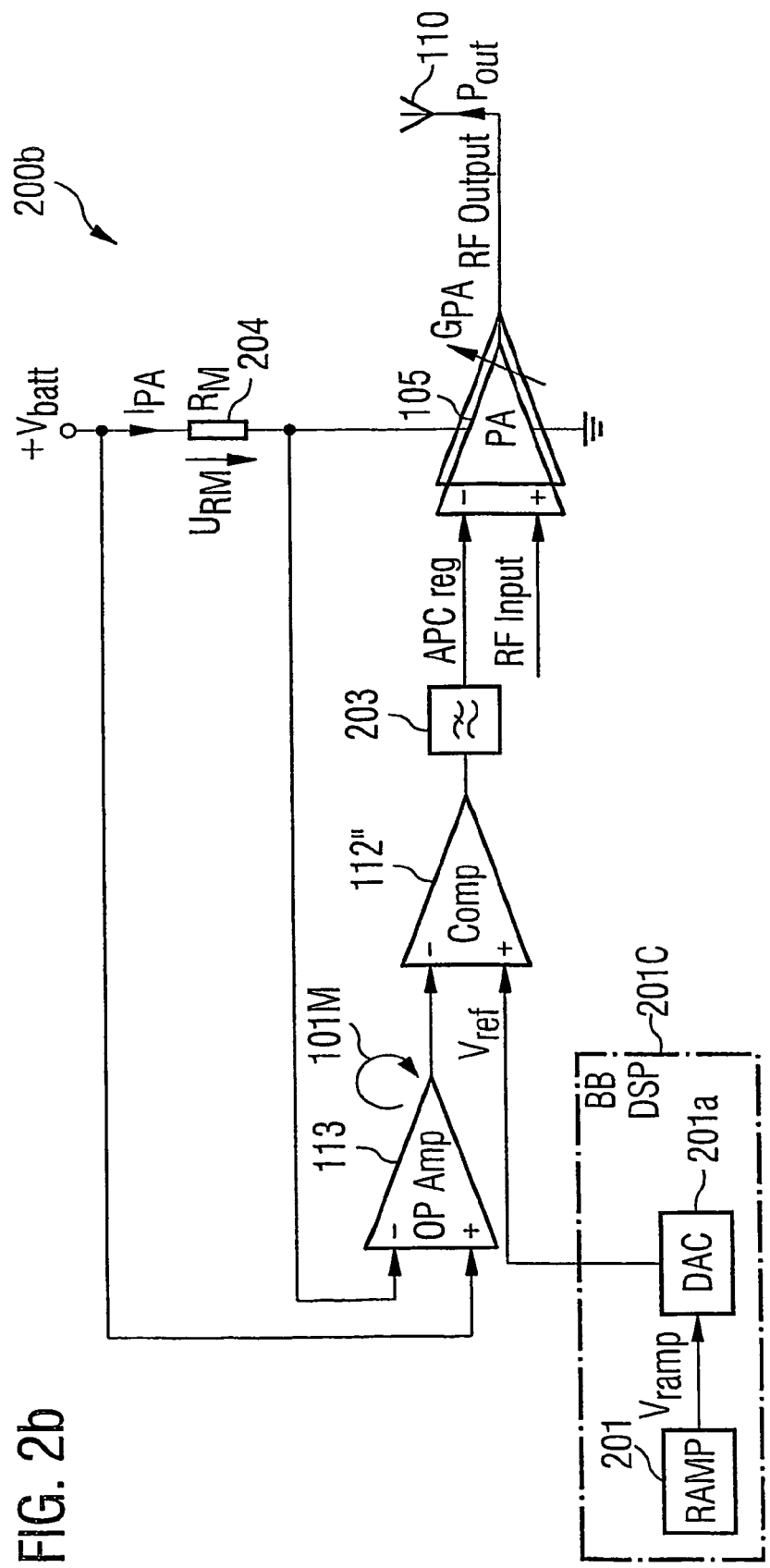
FIG. 2b is a block diagram that shows a technical realization of this current sense APC loop depicted in FIG. 2a, FIG. 3a is a block diagram illustrating the principle of the proposed current sense APC loop according to one embodiment of the present invention.
Figure 3A:
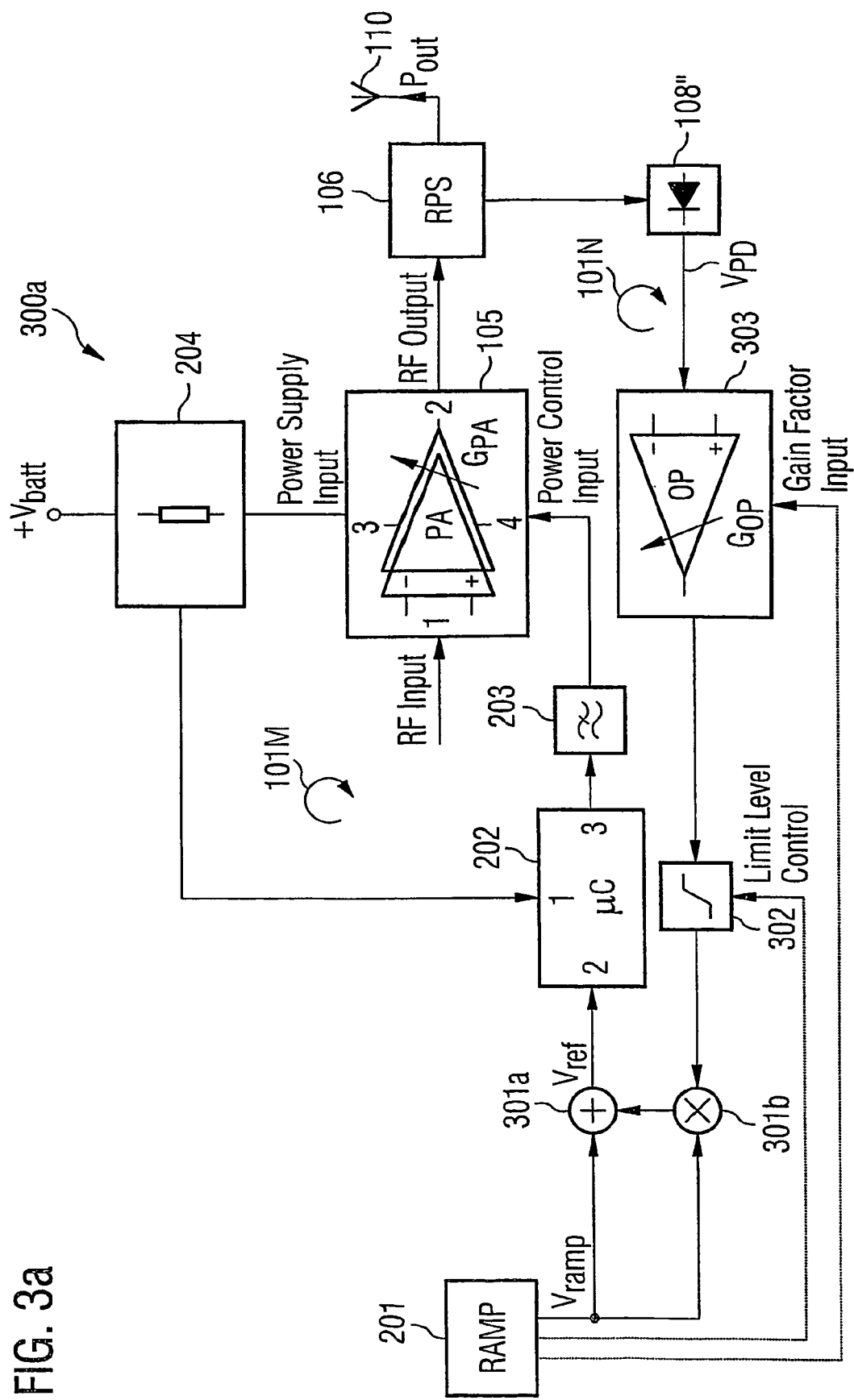
FIG. 3b is a block diagram showing a digital implementation of the proposed current sense APC loop according to the embodiment depicted in FIG. 3a, FIG. 3c is a block diagram showing an analog implementation of the proposed current sense APC loop according to said embodiment depicted in FIG. 3a, FIGS. 4a+b are two parts of a flow chart illustrating a method for stabilizing the power level $P_{out}$ of a modulated RF signal x(t) to be transmitted by the mobile transmitter of a wireless communication device according to the present invention in order to prevent ongoing calls from being released in case the transmitting antenna of said transmitter is mismatched to said power amplifier, and FIGS. 4c+d are two parts of the flow chart depicted in FIGS. 4a+b which illustrate the step of calculating a reference signal $V_{ref}$ representing the nominal power level $P_{ref}$ for the RF power $P_{out}$ of a modulated RF signal x(t) to be transmitted according to two alternatives of the present invention.

One embodiment of the invention refers to a closed-loop power control circuitry consisting of two closed-loop circuits 101M and 101N integrated into the analog front end of a mobile RF transmitter 300a as depicted in FIG. 3a which are used for stabilizing the radiated power level $P_{out}$ of an RF signal x(t) to be transmitted at the output port of a variable-gain power amplifier 105 integrated into the transmitter. Said power control circuitry 101M+N thereby comprises a current sense loop 101M for compensating instabilities of the power amplifier 105 caused by temperature drifts dT/dt or battery voltage drifts $dU_{batt}/dt$, etc. This current sense loop 101M features an integrated microcontroller 202 (μC) having one input port (2) supplied with a reference signal $V_{ref}$ representing the nominal power level $P_{ref}$ for the output power $P_{out}$ of the RF signal x(t) to be transmitted and a further input port (1) supplied with a signal which is derived from a voltage drop $U_{RM}$ at a low-ohm resistor $R_M$ serving as a current sensor 204 in the power supply line of the power amplifier 105, wherein said voltage drop $U_{RM}$ is proportional to the DC supply current $I_{PA}$ of the variable-gain power amplifier 105. The output signal of said microcontroller 202 is fed to the first input port (the power control input port) of the variable-gain power amplifier 105. Furtheron, the power control circuitry 101M+N is equipped with a digital signal processing means 201C for providing a reference ramp signal $V_{ramp}$ used for calculating said reference signal $V_{ref}$. To prevent an ongoing call from being released in case the transmit antenna 110 of the mobile RF transmitter 300a, 300b or 300c is mismatched to said power amplifier 105, said transmitter comprises means for performing an additional regulation of the power control loop's reference signal $V_{ref}$, in particular decoupling means 106 (such as a directional coupler 106' or a circulator 106") at the output port of the power amplifier 105 for providing a DC feedback signal $V_{PD}$ representing the reflected wave of the RF signal x(t) to be transmitted, power sensing means 108 for detecting the RF power of the DC feedback signal $V_{PD}$, and a feedback loop 101N for feeding a reference signal $V_{ref}$ derived from said DC feedback signal $V_{PD}$ to the first input port of said comparator stage 112" in order to increase the radiated power $P_{out}$ of said RF signal x(t) in case of an antenna mismatch.

Figure 3B:
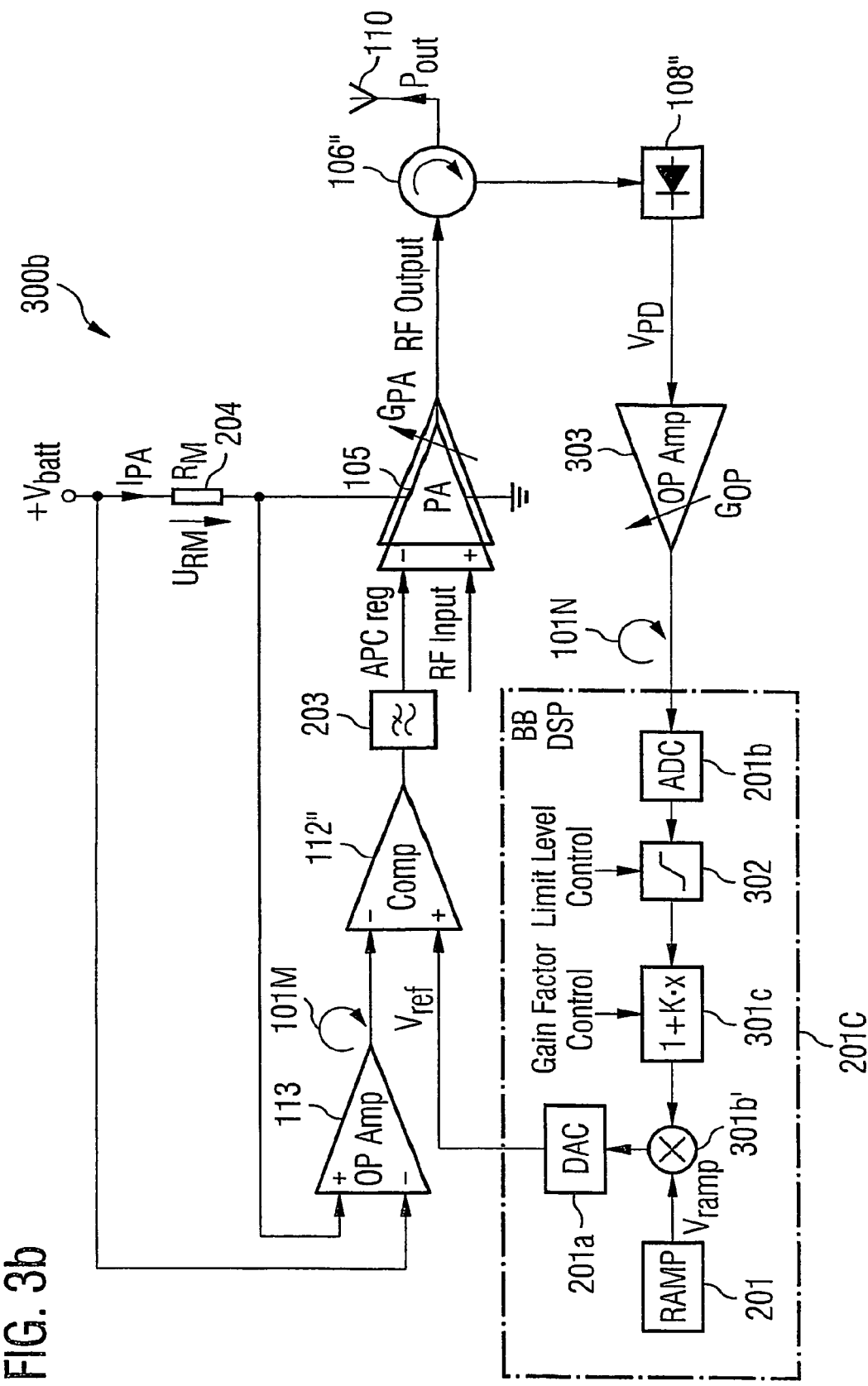

As depicted in FIGS. 3b+c, which show a digital realization 300b and an analog realization 300c of the above-mentioned current sense APC loop 200a, respectively, said microcontroller 202 comprises an operational amplifier 113 which is used for amplifying a signal derived from said voltage drop $U_{RM}$ and a comparator stage 112" with a first input port supplied with a reference signal $V_{ref}$ representing the nominal power level $P_{ref}$ for the output power $P_{out}$ of the RF signal x(t) to be transmitted and a second input port supplied with an amplified version of the signal which is derived from said voltage drop $U_{RM}$.

Figure 3C:
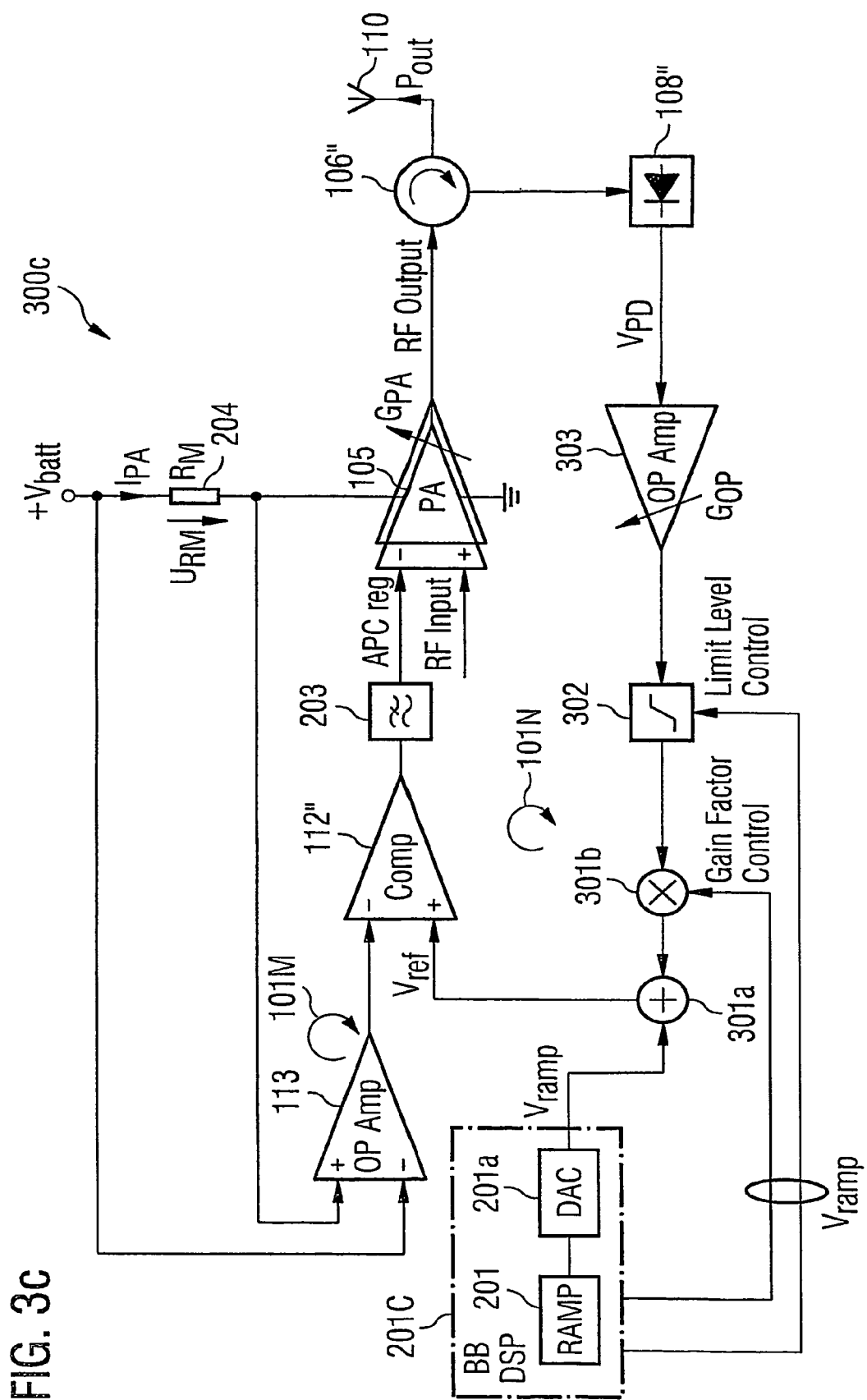

According to the central idea of the present invention, said feedback loop 101N comprises analog and/or digital signal processing means 301a, 301b, 301b', 301c and 302 for calculating said reference signal $V_{ref}$ from the detected DC feedback signal $V_{PD}$. As depicted in FIG. 3c, which exhibits an analog implementation of the proposed current sense APC loop 101M+N according to the embodiment 300a depicted in FIG. 3a, said analog signal processing means comprise a multiplier 301b for multiplying an amplified, analog-to-digital-converted, amplitude-limited and normalized version $K \cdot G_{OP} \cdot V_{PD}$ of said DC feedback signal $V_{PD}$, wherein K is a normalization factor (in $V^{-1}$) and $G_{OP}$ denotes the gain factor of an operational amplifier 303 in said feedback loop 101N, by the reference ramp signal $V_{ramp}$, as well as a summation element 301a used for adding the output signal $V_{ramp} \cdot K \cdot G_{OP} \cdot V_{PD}$ of the multiplication element 301b to the reference ramp signal $V_{ramp}$, thereby yielding said reference signal $V_{ref}$. As depicted in FIG. 3b, which shows a digital implementation of the proposed current sense APC loop 101M+N according to the embodiment depicted in FIG. 3a, said digital signal processing means 201C comprises a multiplication element 301b' for multiplying a gain factor $\chi := 1 + K \cdot G_{OP} \cdot V_{PD}$ supplied by a gain factor control unit 301c by the reference ramp signal $V_{ramp}$, thus yielding said reference signal $V_{ref}$.

In case there is no close subject to the antenna 110 of the transmitter 300a (300b, 300c), the antenna load is nominal and $V_{PD}$ is very small such that X is almost equal to 1, the output signal of the multiplier 301b is almost equal to zero and $V_{ref}$ is almost equal to $V_{ramp}$. Otherwise, if there is a subject very close to the antenna 110, the antenna load is changed and $V_{PD}$ is increased. If the gain factor $G_{OP}$ of the operational amplifier 303 is not set to zero, $\chi$ is greater than 1 (for K>0), $V_{PD}$ is amplified by said operational amplifier 303 and, in case $V_{PD}$ exceeds a predefined threshold $V_{thresh}$, $V_{PD}$ is amplitude-limited by the limit level control unit 302. Hence, the output signal of said multiplier 301b is much greater than zero and $V_{ref}$ is increased compared to $V_{ramp}$. As shown in FIG. 3a, the values of K, $G_{OP}$ and $V_{thresh}$ can individually be set by a control unit 201 in order to tune said feedback loop 101N.

A further embodiment of the present invention, which is illustrated by the flow chart depicted in FIGS. 4a-d, refers to a method for stabilizing the power level $P_{out}$ of a modulated RF signal x(t) to be transmitted at the output port of a variable-gain power amplifier 105 integrated into a mobile RF transmitter 300a, 300b or 300c of a wireless telecommunication device in order to prevent an ongoing call from being released in case the transmit antenna 110 of said transmitter 300a, 300b or 300c is mismatched to said power amplifier 105. After having detected (S1) the voltage level $V_{PD}$ of a DC feedback signal which represents the reflected wave of said RF signal x(t), a reference signal $V_{ref}$ representing the nominal power level $P_{ref}$ for the output power $P_{out}$ of the RF output signal x(t) is calculated (S1A) as a function of a reference ramp signal $V_{ramp}$, supplied by a digital signal processing means 201C integrated into said transmitter, and the DC feedback signal $V_{PD}$. After that, the obtained reference signal $V_{ref}$ is fed (S2) to a first input port of a comparator stage 112" in the feedback chain of the current sense loop 101M. Simultaneously, the DC supply current $I_{PA}$ of the power amplifier 105 is measured (S3) by sensing a voltage drop $U_{RM}$ proportional to the DC supply current $I_{PA}$ at a low-ohm resistor $R_M$ serving as a current sensor 204 that is placed in the power supply line of the variable-gain power amplifier 105. Then, a signal derived from this voltage drop $U_{RM}$ is fed (S4) to a second input port of said comparator stage 112" and compared (S5) with the voltage level of said reference signal $V_{ref}$. Thereafter, a signal proportional to the difference ($U_{RM}-V_{ref}$) between the signal derived from said voltage drop $U_{RM}$ and the calculated reference signal $V_{ref}$ is fed (S6) to a first input port (the power control input port) of the power amplifier 105 such that the actual power level $P_{out}$ can be adjusted (S7) by amplifying the low-pass-filtered difference between the output signal of said comparator stage 112" and the RF signal x(t) to be transmitted before being amplified at a second input port of the variable-gain power amplifier 105.

According to a first alternative of this embodiment, the step of calculating (S1A) said reference signal $V_{ref}$ as a function of a reference ramp signal $V_{ramp}$ and the aforementioned DC feedback signal $V_{PD}$ representing the reflected wave of the RF signal x(t) to be transmitted is realized by the steps of multiplying (S1a') an amplified, analog-to-digital-converted, amplitude-limited and normalized version $K \cdot G_{OP} \cdot V_{PD}$ of the DC feedback signal $V_{PD}$, wherein $G_{OP}$ denotes the gain factor of an operational amplifier 303 in said feedback loop 101N and K is a normalization factor (in $V^{-1}$), by the reference ramp signal $V_{ramp}$ and adding (S1a") the output signal $V_{ramp} \cdot K \cdot G_{OP} \cdot V_{PD}$ of the multiplication step (S1a') to the reference ramp signal $V_{ramp}$, thereby yielding said reference signal $$V_{ref}(V_{PD}, V_{ramp}) = V_{ramp} + V_{ramp} \cdot K \cdot G_{OP} \cdot V_{PD} = V_{ramp} \cdot \chi \quad (4a)$$

with $\chi := 1 + K \cdot G_{OP} \cdot V_{PD}$. (4b)

According to a second alternative of this embodiment, said calculation step (S1A) is realized by the step of multiplying (S1b) a gain factor $\chi := 1 + K \cdot G_{OP} \cdot V_{PD}$ as defined in equation (4b), which is supplied by a gain factor control unit 301c, by the reference ramp signal $V_{ramp}$, thus yielding said reference signal $V_{ref}$ as given by equation (4a).

Finally, a still further embodiment of the present invention pertains to a mobile RF transmitter 300a, 300b or 300c which comprises a closed-loop power control circuitry 101M+N as described above.

TABLE

Depicted Features and Their Corresponding Reference Signs

| No. | Technical Feature (System Component or Procedure Step) |
|---|---|
| 100a | schematic block diagram of an analog RF signal generator comprising a conventional automatic power control (APC) loop 101S according to the state of the art which is used for stabilizing the power level $P_{out}$ at the output port of the RF signal generator 100a, characterized in that the output signal of a comparator stage 112' supplied with a reference signal $V_{ref}$ representing the nominal power level $P_{ref}$ for the desired output power level of the RF output signal x(t), whose actual output power level $P_{out}$ is supplied by a directional coupler 106' and fed back to the APC loop 101S by a wideband detector diode 108', is fed to the control input port of an electronically controllable attenuator 103' controlling said output power level $P_{out}$ |
| 100b | schematic block diagram of a QAM transmitter having an automatic power control (APC) circuitry 101 according to the state of the art which is used for stabilizing the |

TABLE-continued

Depicted Features and Their Corresponding Reference Signs

| No. | Technical Feature (System Component or Procedure Step) |
|---|---|
| | power level $P_{out}$ at the output port of the QAM transmitter 100b, wherein the output port of a comparator stage 112 supplied with a reference signal $V_{ref}$ representing the nominal power level $P_{ref}$ for the power $P_{out}$ of the modulated RF signal x(t) to be transmitted, whose actual output power level is supplied by a directional coupler 106' and fed back to the APC loop 101 by a wideband detector diode 108, is connected to the gain control input port of a variable-gain power amplifier 105 controlling the output power level $P_{out}$ |
| 101 | automatic power control (APC) loop of the QAM transmitter 100b according to the state of the art (cf. FIG. 1b) which is used for stabilizing the power level $P_{out}$ at the output port of the QAM transmitter 100b, characterized in that the output signal of a comparator stage 112 supplied with a reference signal $V_{ref}$ representing the nominal power level $P_{ref}$ for the output power $P_{out}$ of the modulated RF signal x(t), whose actual output power level $P_{out}$ is supplied by a directional coupler 106' and fed back to the APC loop 101 by a wideband detector diode 108, is fed to the gain control input port of a variable-gain power amplifier 105 controlling the power level $P_{out}$ of the RF output signal x(t) |
| 101S | APC loop of the RF signal generator 100a according to the state of the art (cf. FIG. 1a) which is used for stabilizing the power level $P_{out}$ at the output port of the RF signal generator 100a, characterized in that the output signal of a comparator stage 112' supplied with a reference signal $V_{ref}$ representing the nominal power level $P_{ref}$ for the output power $P_{out}$ of the modulated RF signal x(t) to be transmitted, whose actual output power level $P_{out}$ is supplied by a directional coupler 106' and fed back to the APC loop 101S by a wideband detector diode 108', is fed to the control input port of an electronically controllable attenuator 103' controlling the power level $P_{out}$ of the RF output signal x(t) |
| 101M | current sense (APC) loop of a mobile transmitter 300a (300b, 300c) according to the state of the art (cf. FIGS. 2a + b and 3a-c) which is used for stabilizing the power level $P_{out}$ at the output port of the mobile transmitter 200a (200b) or 300a (300b, 300c), characterized in that the output signal of an integrated comparator stage 112'' having a first input port supplied with a reference signal $V_{ref}$ representing the nominal power level $P_{ref}$ for the desired output power level of the RF output signal x(t) and a second input port supplied with a signal derived from a voltage drop $U_{RM}$ at a low-ohm resistor $R_M$ serving as a current sensor 204 which is placed in the power supply line of an integrated variable-gain power amplifier 105, said voltage drop $U_{RM}$ being proportional to the DC supply current $I_{PA}$ of the variable-gain power amplifier 105, is fed to a first input port (the power control input port) of a variable-gain power amplifier 105 controlling the power level $P_{out}$ of the RF output signal x(t) |
| 101N | feedback loop used for feeding a reference signal $V_{ref}$ representing the nominal power level $P_{ref}$ for the desired output power level of the RF output signal x(t) to the first input port of the comparator stage 112'', said reference signal $V_{ref}$ being calculated from a DC feedback signal $V_{PD}$ representing the reflected wave of the RF signal x(t) to be transmitted supplied by a power sensor 106 in form of a directional coupler 106' or a circulator 106'' and sensed by a wideband detector diode 108'' |
| 102 | local oscillator (LO) in the modulator stage 104 of the QAM transmitter 100b, which provides a sinusoidal oscillator signal c(t) with a tunable frequency |
| 102' | local oscillator (LO) of the RF signal generator 100a, which provides the amplitude modulator stage 103' with a sinusoidal oscillator signal c(t) |
| 103' | electronically controllable attenuator of the RF signal generator 100a, e.g. an amplitude modulator stage comprising current-controlled PIN diodes realizing a tunable resistor with hybrid microwave integrated circuit (MIC) technology, which is used for attenuating the power level $P_c$ of the oscillator signal supplied by the local oscillator 102' |
| 104 | modulator stage of the QAM transmitter 100b, comprising two up-conversion mixers 104a + b, driven by the local oscillator 102, for directly up-converting the in-phase (I) and quadrature (Q) signal of a signal to be transmitted from the baseband to an RF band, a 90-degree phase shifter 104c, connected to one input port of the up-conversion mixer 104a, and a summation element 104d for combining the RF output signals of the two up-conversion mixers 104a and 104b |
| 104a | $1^{st}$ up-conversion mixer of the modulator stage 104, driven by the local oscillator 102, for directly up-converting the quadrature (Q) signal of a signal to be transmitted from the baseband to an RF band |
| 104b | $2^{nd}$ up-conversion mixer of the modulator stage 104, driven by the local oscillator 102, for directly up-converting the in-phase (I) signal of a signal to be transmitted from the baseband to an RF band |
| 104c | 90-degree phase shifter (Hilbert transformer) of the modulator stage 104, connected to one input port of the up-conversion mixer 104a |
| 104d | summation element of the modulator stage 104, used for combining the RF output signals of the two up-conversion mixers 104a and 104b |
| 105 | variable-gain power amplifier (PA), used for controlling the power level $P_{out}$ of the RF signal x(t) to be transmitted at the output port of the QAM transmitter 100b (the mobile transmitter 200a, 200b, 300a, 300b, or 300c), its gain factor $G_{PA}$ being controlled by the output signal of the comparator stage 112 (or an input signal derived from a voltage drop $U_{RM}$ at a low-ohm resistor $R_M$ serving as a current sensor 204 which is placed in the power supply line of the variable-gain power amplifier 105, |

TABLE-continued

Depicted Features and Their Corresponding Reference Signs

| No. | Technical Feature (System Component or Procedure Step) |
|---|---|
| | said voltage drop $U_{RM}$ being proportional to the DC supply current $I_{PA}$ of the variable-gain power amplifier 105, being supplied by the comparator stage 112") |
| 106 | decoupling means (RPS) at the output port of the variable-gain power amplifier 105, realized as a directional coupler 106' or a circulator 106", which provides the feedback chain of the feedback loop 101N with the extracted DC feedback signal $v_{PD}$ representing the reflected wave of the RF signal x(t) to be transmitted |
| 106' | directional coupler at the output port of the variable-gain power amplifier 105, which provides the APC loop 101S (101) with the extracted DC feedback signal $V_{PD}$ representing the reflected wave of the RF signal x(t) to be transmitted |
| 106" | circulator at the output port of the variable-gain power amplifier 105, which provides the feedback chain of the feedback loop 101N with the extracted DC feedback signal $V_{PD}$ representing the reflected wave of the RF signal x(t) to be transmitted |
| 108 | wideband detector diode in the feedback chain of the APC loop 101, used for detecting the actual RF power level of said DC feedback signal $V_{PD}$ |
| 108' | wideband detector diode in the feedback chain of the APC loop 101S for detecting the actual RF power level of said DC feedback signal $V_{PD}$ |
| 108" | wideband detector diode in the feedback chain of the feedback loop 101N, used for detecting the actual RF power level of said DC feedback signal $V_{PD}$ |
| 108E | external automatic power control (APC) detector (not shown) for detecting the actual power level $P_{out}$ of said DC feedback signal $V_{PD}$ |
| 109' | controllable current source of the RF signal generator 100a for generating a current $I_G$ whose strength is direct proportional to the nominal value $P_{ref}$ of the desired output power level |
| 110 | transmit (Tx) antenna of the QAM transmitter 100b |
| 112 | comparator stage in the APC loop 101 of the QAM transmitter 100b, supplied with a reference signal $V_{ref}$ representing the nominal power level $P_{ref}$ for the desired output power level of the RF output signal, whose actual output power level $P_{out}$ is supplied by a directional coupler 106' and fed back to the APC loop 101 by a wideband detector diode 108, wherein the output signal of said comparator stage 112 is fed to the gain control input port of the power amplifier 105 (cf. FIG. 1b) |
| 112' | comparator stage in the APC loop 101S of the RF signal generator 100a, supplied with a reference signal $V_{ref}$ representing the nominal power level $P_{ref}$ for the desired output power level of the RF output signal, whose actual output power level $P_{out}$ is supplied by a directional coupler 106' and fed back to the APC loop 101S by a wideband detector diode 108', wherein the output signal of said comparator stage 112' is fed to the gain control input port of the electronically controllable attenuator 103' (cf. FIG. 1a) |
| 112" | comparator stage in the APC loop 101M of the mobile transmitter 300a (300b, 300c), supplied with a reference signal $V_{ref}$ representing the nominal power level $P_{ref}$ for the desired output power level of the RF output signal, whose output signal is fed to a first input port (the power control input port) of the variable-gain power amplifier 105 (cf. FIGS. 3a-c) |
| 113 | operational amplifier (OP Amp), which is used for amplifying a signal to be fed to the second input port of the comparator stage 112", said signal derived from a voltage drop $u_{RM}$ at a low-ohm resistor $R_M$ placed in the power supply line of the variable-gain power amplifier 105, wherein said voltage drop $u_{RM}$ is proportional to the DC supply current $I_{PA}$ of the variable-gain power amplifier 105 sensed by the current sensor 204 |
| 114a' | RF input port of the RF signal generator 100a for the external APC detector 108E |
| 114b' | RF output port of the RF signal generator 100a |
| 200a | block diagram illustrating the principle of a conventional closed-loop power control circuitry realized as a current sense loop according to the state of the art (in the following called current sense APC loop) |
| 200b | block diagram showing a technical realization of this current sense APC loop 200a |
| 201 | baseband block of the BB DSP 201C, which provides a reference ramp signal $V_{ramp}$ for calculating a reference signal $V_{ref}$ representing the nominal power level $P_{ref}$ for the desired output power level of the RF signal x(t) to be transmitted |
| 201a | digital-to-analog converter (DAC) of the BB DSP 201C |
| 201b | analog-to-digital converter (ADC) of the BB DSP 201C |
| 201C | baseband digital signal processor (BB DSP), comprising the baseband block for providing the reference ramp signal $V_{ramp}$ and said digital-to-analog converter 201a |
| 202 | microcontroller (μC) in the APC loop 101M of the mobile transmitter 300a (300b or 300c), said microcontroller 202 realizing said operational amplifier 113 and said comparator stage 112" |
| 203 | low-pass filter (LPF), used for filtering the output signal of the comparator stage 112" to be fed to the first input port (the power control input port) of the variable-gain power amplifier 105 |
| 204 | current sensor, realized as a low-ohm resistor $R_M$ which is placed in the power supply line of the variable-gain power amplifier 105, for measuring the DC supply current $I_{PA}$ of the variable-gain power amplifier 105 by sensing a voltage drop $U_{RM}$ proportional to the supply current $I_{PA}$ at said low-ohm resistor $R_M$ |
| 300a | block diagram illustrating the principle of the proposed current sense APC loop 101M + N according to one embodiment of the present invention |
| 300b | block diagram showing a digital implementation of the proposed current sense APC loop 101M + N according to said embodiment 300a |

TABLE-continued

Depicted Features and Their Corresponding Reference Signs

Figure 4A:
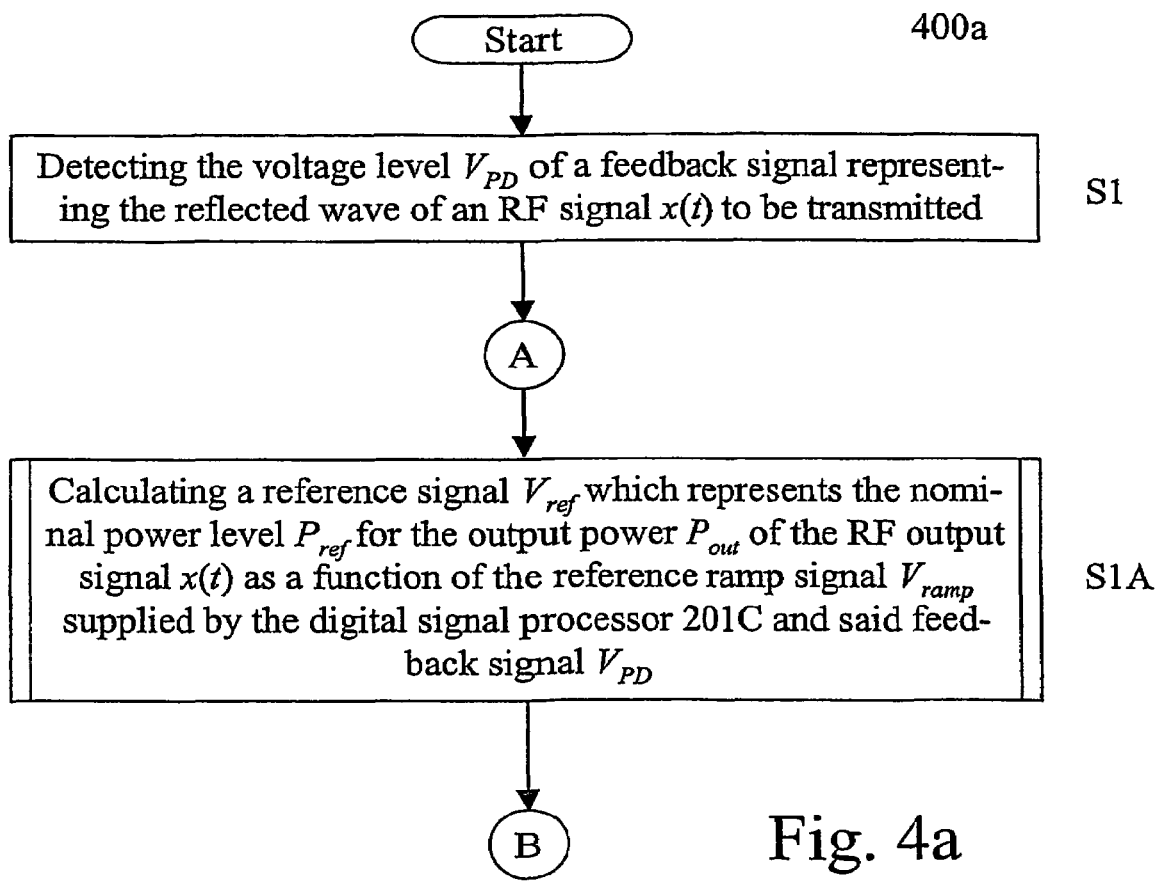
Figure 4B:
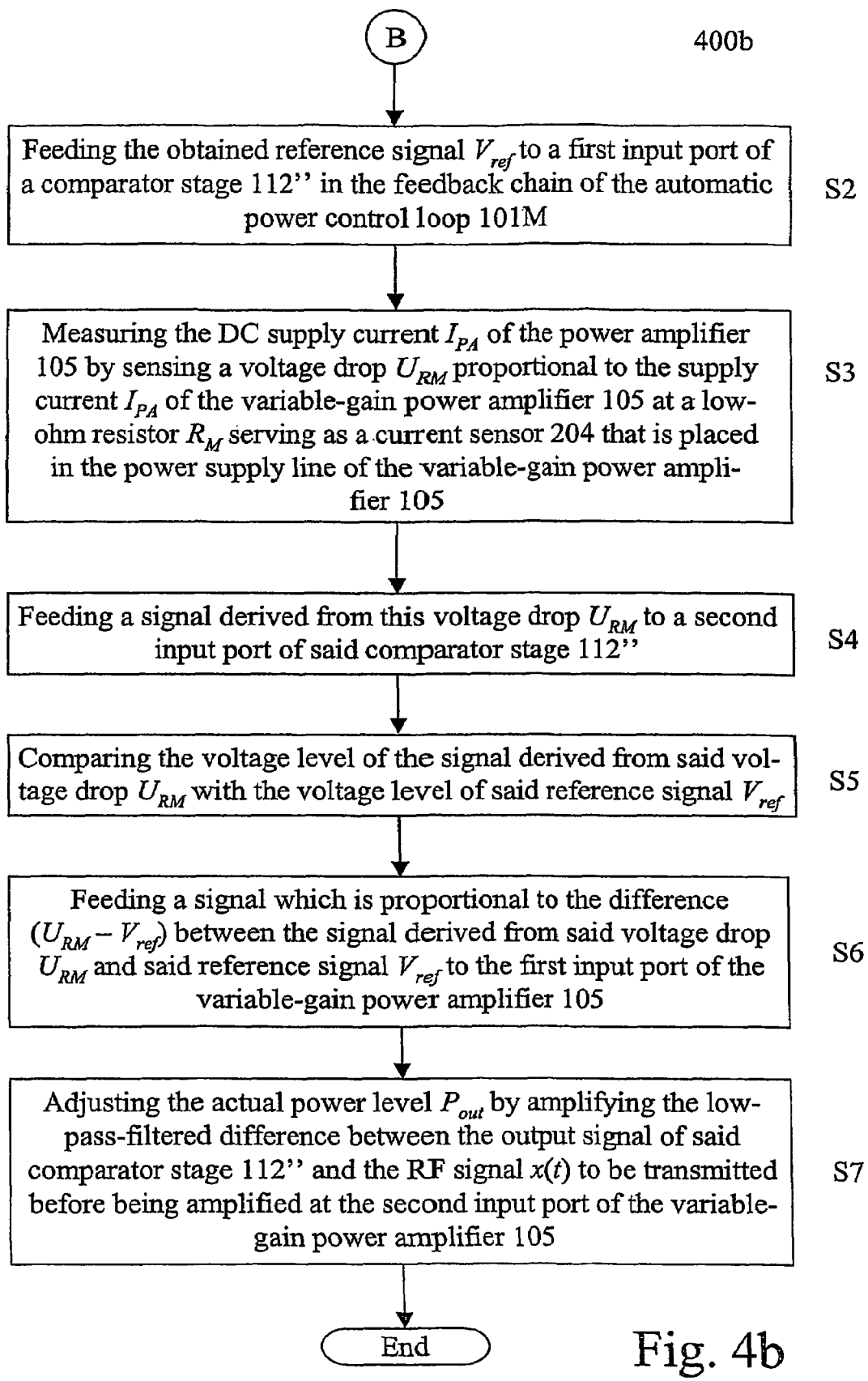
Figure 4C:
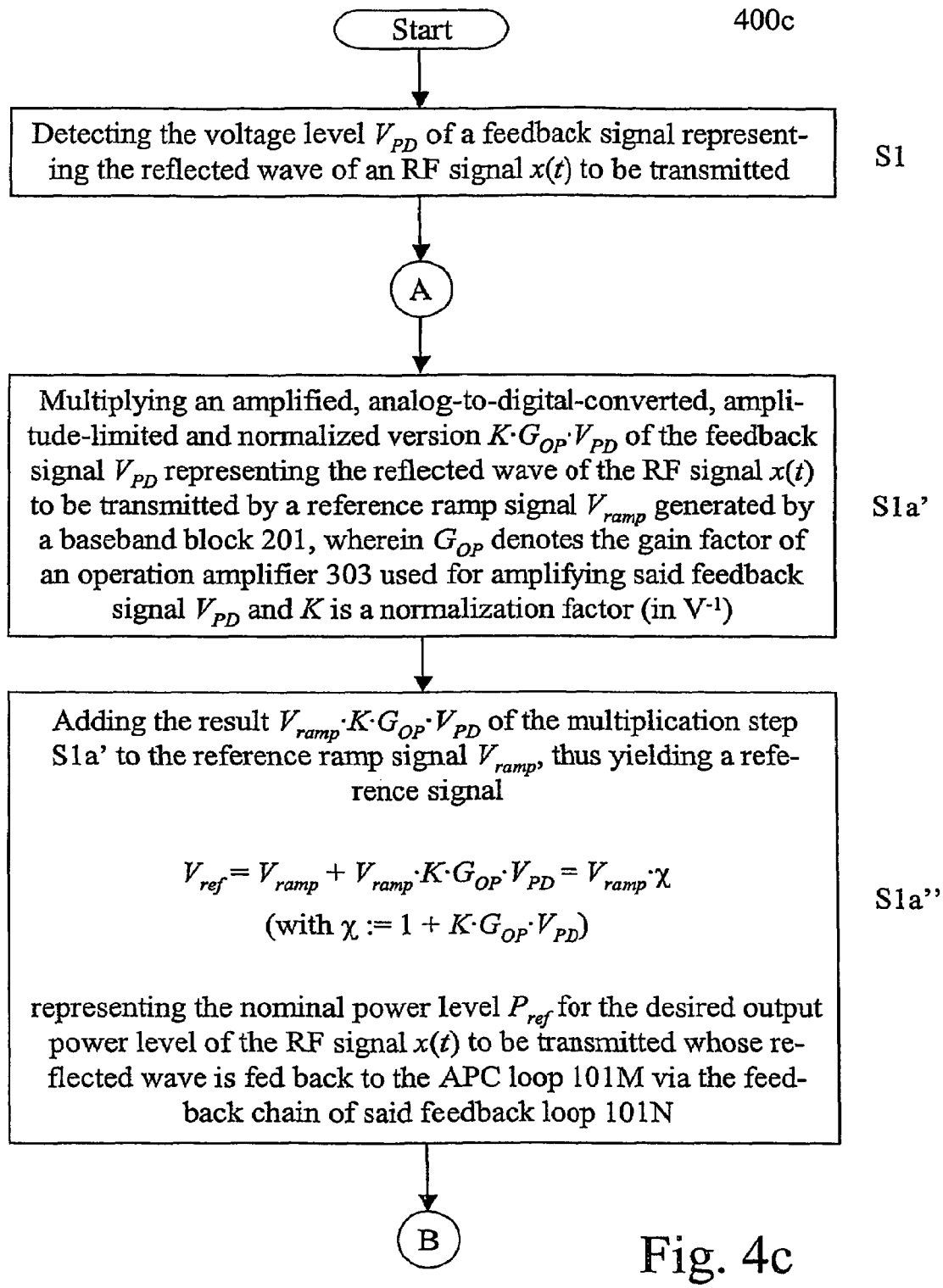
Figure 4D:
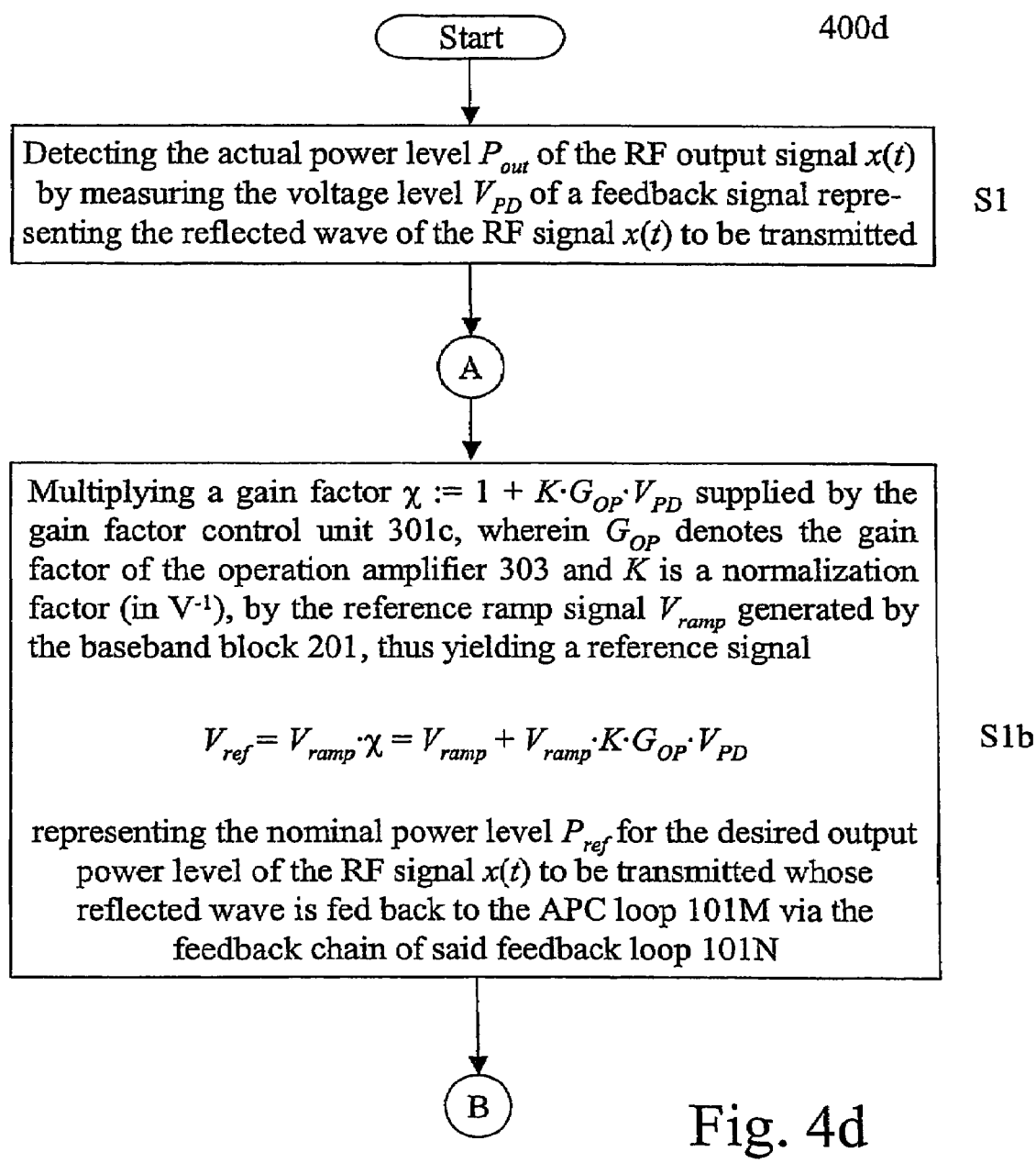

| No. | Technical Feature (System Component or Procedure Step) |
|---|---|
| 300c | block diagram showing an analog implementation of the proposed current sense APC loop 101M + N according to said embodiment 300a |
| 301a | summation element, used for adding the output signal $V_{ramp} \cdot K \cdot G_{OP} \cdot V_{PD}$ of the multiplication element 301b, wherein K denotes a normalization factor (in $V^{-1}$), to the reference ramp signal $V_{ramp}$ generated by the baseband block 201, thereby yielding a reference signal $V_{ref} = V_{ramp} + V_{ramp} \cdot K \cdot G_{OP} \cdot V_{PD} = V_{ramp} \cdot \chi$ (with $\chi := 1 + K \cdot G_{OP} \cdot V_{PD}$) representing the nominal power level $P_{ref}$ for the desired output power level of the RF output signal fed back to the APC loop 101M via the feedback chain of said feedback loop 101N |
| 301b | multiplier, used for multiplying an amplified, analog-to-digital-converted, amplitude-limited and normalized version $K \cdot G_{OP} \cdot V_{PD}$ of the DC feedback signal $V_{PD}$ representing the reflected wave of the RF signal x(t) to be transmitted, wherein $G_{OP}$ denotes the gain factor of the operational amplifier 303 in the feedback loop 101N and K is a normalization factor (in $V^{-1}$), by the reference ramp signal $V_{ramp}$ |
| 301b' | multiplication element, used for multiplying a gain factor $\chi := 1 + K \cdot G_{OP} \cdot V_{PD}$ supplied by the gain factor control unit 301c by the reference ramp signal $V_{ramp}$ generated by the baseband block 201 |
| 301c | gain factor control unit of the BB DSP 201C, which provides said gain factor $\chi$ |
| 302 | limit level control unit of the BB DSP 201C for limiting the amplitude of the amplified DC feedback signal $v_{PD}$ representing the reflected wave of the RF signal x(t) to be transmitted |
| 303 | operational amplifier (OP Amp) having the gain factor $G_{OP}$, which is used for amplifying said DC feedback signal $V_{PD}$ |
| 400a, 400b | first and second part of a flow chart illustrating a method for stabilizing the power level $P_{out}$ of a modulated RF signal x(t) to be transmitted by the mobile transmitter 300a, 300b or 300c of a wireless communication device according to the present invention to prevent an ongoing call from being released in case the antenna 110 of said transmitter 300a, 300b or 300c is mismatched to said power amplifier 105 |
| 400c | part of the flow chart depicted in FIGS. 4a + b, which illustrates the step of calculating (S1A) said reference signal $V_{ref}$ as a function of a reference ramp signal $V_{ramp}$ and the aforementioned DC feedback signal $v_{PD}$ representing the reflected wave of the RF signal x(t) to be transmitted according to a first aspect of the present invention realized by the substeps S1a' and S1a'' |
| 400d | part of the flow chart depicted in FIGS. 4a + b, which illustrates the step of calculating (S1A) said reference signal $V_{ref}$ as a function of a reference ramp signal $V_{ramp}$ and the aforementioned DC feedback signal $V_{PD}$ representing the reflected wave of the RF signal x(t) to be transmitted according to a second aspect of the present invention realized by step S1b |
| S | switch of the RF signal generator 100a for selectively choosing an internal APC detector 108' or an external APC detector 108E |
| S1 | step #1: detecting the voltage level $V_{PD}$ of a DC feedback signal representing the reflected wave of an RF signal x(t) to be transmitted |
| S1A | step #1A: calculating a reference signal $V_{ref}$ representing the nominal power level $P_{ref}$ for the output power $P_{out}$ of the RF output signal x(t) as a function of the reference ramp signal $V_{ramp}$ supplied by the digital signal processor 201C and said DC feedback signal $V_{pD}$ |
| S1a' | step #1a': multiplying an amplified, analog-to-digital-converted, amplitude-limited and normalized version $K \cdot G_{OP} \cdot V_{PD}$ of the DC feedback signal $V_{PD}$ representing the reflected wave of the RF signal x(t) to be transmitted by a reference ramp signal $V_{ramp}$ generated by a baseband block 201, wherein $G_{OP}$ denotes the gain factor of an operational amplifier 303 used for amplifying said DC feedback signal $V_{PD}$ and K is a normalization factor (in $V^{-1}$) |
| S1a'' | step #1a'': adding the result $V_{ramp} \cdot K \cdot G_{OP} \cdot V_{PD}$ of the multiplication step S1a' to the reference ramp signal $V_{ramp}$, thus yielding a reference signal $V_{ref}(V_{PD}, V_{ramp}) = V_{ramp} + V_{ramp} \cdot K \cdot G_{OP} \cdot V_{PD} = V_{ramp} \cdot \chi$ (with $\chi := 1 + K \cdot G_{OP} \cdot V_{PD}$) representing the nominal power level $P_{ref}$ for the desired output power level of the RF signal x(t) to be transmitted whose reflected wave is fed back to the APC loop 101M via the feedback chain of said feedback loop 101N |
| S1b | step #1b: multiplying a gain factor $\chi := 1 + K \cdot G_{OP} \cdot V_{PD}$ supplied by the gain factor control unit 301c, wherein $G_{OP}$ denotes the gain factor of the operational amplifier 303 and K is a normalization factor (in $V^{-1}$), by the reference ramp signal $V_{ramp}$ generated by the baseband block 201, thus yielding a reference signal $V_{ref}(V_{PD}, V_{ramp}) = V_{ramp} \cdot \chi = V_{ramp} + V_{ramp} \cdot K \cdot G_{OP} \cdot V_{PD}$ representing the nominal power level $P_{ref}$ for the desired output power level of the RF signal x(t) to be transmitted whose reflected wave is fed back to the APC loop 101M via the feedback chain of said feedback loop 101N |
| S2 | step #2: feeding the obtained reference signal $V_{ref}$ to a first input port of a comparator stage 112'' in the feedback chain of the automatic power control loop 101M |
| S3 | step #3: measuring the DC supply current $I_{PA}$ of the variable-gain power amplifier 105 by sensing a voltage drop $U_{RM}$ proportional to the DC supply current $I_{PA}$ at a low-ohm resistor $R_M$ serving as a current sensor 204 which is placed in the power supply line of the variable-gain power amplifier 105 |

TABLE-continued

Depicted Features and Their Corresponding Reference Signs

| No. | Technical Feature (System Component or Procedure Step) |
|---|---|
| S4 | step #4: feeding a signal derived from this voltage drop $U_{RM}$ to a second input port of said comparator stage 112" |
| S5 | step #5: comparing the voltage level of the signal derived from said voltage drop $U_{RM}$ with the voltage level of said reference signal $V_{ref}$ |
| S6 | step #6: feeding a signal proportional to the difference ($U_{RM} - V_{ref}$) between the signal derived from said voltage drop $u_{rm}$ and the calculated reference signal $V_{ref}$ to the first input port (the power control input port) of the power amplifier 105 |
| S7 | step #7: adjusting the actual power level $P_{out}$ by amplifying the low-pass-filtered difference between the output signal of said comparator stage 112" and the RF signal x(t) to be transmitted before being amplified at the second input port of the variable-gain power amplifier 105 |

The invention claimed is:

1. A power control circuitry for controlling the output power level ($P_{out}$) of a signal (x(t)) to be transmitted at the output port of a variable-gain power amplifier, said power control circuitry comprising a current sense loop with an integrated comparator stage having a first input port supplied with a reference signal ($V_{ref}$) representing the nominal power level ($P_{ref}$) for the output power ($P_{out}$) and a second input port supplied with a signal from a current sensor which is placed in the power supply line of a variable-gain power amplifier, wherein the output signal of said comparator stage is fed to the power control input port of the variable-gain power amplifier, and further comprising power sensing means for detecting the power of a feedback signal ($V_{PD}$) representing the reflected wave of the signal (x(t)) to be transmitted, and a feedback loop for feeding said reference signal ($V_{ref}$) derived from said feedback signal ($V_{PD}$) and a reference ramp signal ($V_{ramp}$) to the first input port of the comparator stage in order to increase the radiated power ($P_{out}$) of said signal (x(t)) in case a transmit antenna is mismatched to the variable-gain power amplifier.

2. A power control circuitry according to claim 1, including signal processing means comprising a multiplier for multiplying a processed version ($K \cdot G_{OP} \cdot V_{PD}$) of the feedback signal ($V_{PD}$) by the reference ramp signal ($V_{ramp}$), a summation element, used for adding the output signal ($V_{ramp} \cdot K \cdot G_{OP} \cdot V_{PD}$) of the multiplier to the reference ramp signal ($V_{ramp}$), thereby yielding said reference signal ($V_{ref}$).

3. A power control circuitry according to claim 1, including digital signal processing means comprising a multiplication element for multiplying a gain factor ($\chi := 1 + K \cdot G_{OP} \cdot V_{PD}$) supplied by a gain factor control unit by the reference ramp signal ($V_{ramp}$), wherein K is a normalization factor (in $V^{-1}$) and $G_{OP}$ denotes the gain factor of an operational amplifier in said feedback loop, thereby yielding said reference signal ($V_{ref}$).

4. A power control circuitry according to claim 1, including decoupling means at the output port of the variable-gain power amplifier for providing a feedback signal ($V_{PD}$).

5. A power control circuitry according to claim 4, wherein said decoupling means is realized as a directional coupler or a circulator.

6. A wireless telecommunication device, including
a mobile RF transmitter comprising a power control circuitry according to claim 1.

* * * * *

UNITED STATES PATENT AND TRADEMARK OFFICE
CERTIFICATE OF CORRECTION

PATENT NO. : 7,650,122 B2
APPLICATION NO. : 10/595436
DATED : January 19, 2010
INVENTOR(S) : Grigory Itkin and Andrei Kabanov It is certified that error appears in the above-identified patent and that said Letters Patent is hereby corrected as shown below:

Column 3, line 43, "...for stabilizing the power level $P_{out}$, of the RE output signal at..."
should read -- ...for stabilizing the power level $P_{out}$, of the RF output signal at... --

Column 4, line 24, "wherein A..." should read -- wherein $A_c$ --

Column 4, line 30, "...ture signal q(t) from the baseband to the RE band is given by..."
should read -- ...ture signal q(t) from the baseband to the RF band is given by... --

Column 4, line 47, "Before being transmitted, the obtained RE signal x(t) has to..."
should read -- Before being transmitted, the obtained RF signal x(t) has to... --

Signed and Sealed this

Twenty-seventh Day of April, 2010

David J. Kappos
*Director of the United States Patent and Trademark Office*